(12) United States Patent
Johansson

(10) Patent No.: US 6,329,259 B1
(45) Date of Patent: Dec. 11, 2001

(54) COLLECTOR-UP RF POWER TRANSISTOR

(75) Inventor: Ted Johansson, Djursholm (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/583,648

(22) Filed: May 30, 2000

(30) Foreign Application Priority Data

May 31, 1999 (SE) .................................................. 9902005

(51) Int. Cl.[7] ...................... H01L 21/331; H01L 21/8222
(52) U.S. Cl. ............................................ 438/315; 438/309
(58) Field of Search .................................. 438/315, 309, 438/312, 319

(56) References Cited

U.S. PATENT DOCUMENTS

| | | | |
|---|---|---|---|
| 5,006,912 | * 4/1991 | Smith et al. | 357/34 |
| 5,187,108 | 2/1993 | Shinozawa | 437/31 |
| 5,346,840 | * 9/1994 | Fujioka | 437/31 |
| 5,512,496 | 4/1996 | Chau et al. | 437/31 |
| 5,700,701 | 12/1997 | Hill et al. | 437/31 |
| 5,798,539 | * 8/1998 | Jorke | 257/197 |
| 5,821,620 | 10/1998 | Hong | 23/535 |

OTHER PUBLICATIONS

Edhborg, S.; International–Type Search Report; Search Request No. SE99/00727; Apr. 18, 2000; pp. 1–3.

Behammer, D., et al; "Si/SiGe HBTs for Applications in Lower Power ICs" Solid–State Electronics, vol. 39, No. 4, pp. 471–480, 1996.

Cooke, H.F.; "Microwave Transistors: Theory and Design," Proc. IEEE, vol. 59, p. 1163, Aug. 1971.

Schüppen, H.D., "High Speed SiGe Heterobipolar Transistors," Journal of Crystal Growth, 157 (1995), 207–214.

Wahlin, F., International Search Report, International Application No. PCT/SE 00/01002, Sept. 11, 2000, pp. 1–3.

Gruhle, A., et al.; *Recent Advances with SiGe Heterojunction Bipolar Transistors*, Thin Solid Films 294 (1997), pp. 246–249.

* cited by examiner

*Primary Examiner*—Richard Elms
*Assistant Examiner*—Bradley Smith
(74) *Attorney, Agent, or Firm*—Jenkens & Gilchrist

(57) ABSTRACT

A method for manufacturing a low voltage high frequency silicon power transistor applying epitaxial mesa structure using a minimized number of masks has a highly doped silicon $n^{++}$ substrate forming the emitter. Also a low voltage high frequency silicon transistor chip presenting an epitaxial mesa technology silicon power device is presented. The silicon transistor layout presents a collector-up device with a number of single mesa collector structures. The transistor operates with its substrate as a down facing emitter, and base and collector areas together with bonding pads facing up, whereby the parasitic base-to-collector capacitance is almost entirely eliminated with the emitter as substrate. The reduced number of necessary fabrication process steps of this new structure is outlined.

11 Claims, 6 Drawing Sheets

COLLECTOR-UP RF POWER TRANSISTOR

TECHNICAL FIELD

The present invention relates to high-frequency low-voltage silicon RF power devices and particularly to silicon/silicon-germanium collector-up single mesa structures.

BACKGROUND

The speed of today's silicon bipolar junction transistors (BJT) with about 50 GHz $f_T$ (maximum transition frequency) is reaching its physical limitations because of the trade-off between the thickness and resistivity of the base layer. By adding some germanium into the base of a conventional BJT, the high-frequency characteristics can be improved substantially. The new device is a SiGe (silicon germanium) double HBT (heterojunction bipolar transistor) structure. The layer structure is usually grown with MBE (Molecular Beam Epitaxy) or CVD (Chemical Vapor Deposition), but it is also possible to implant Ge into the Si to achieve a similar effect but with less control of the doping profile. During the last years, SiGe HBTs have shown record high-frequency performance for silicon based devices with regards to $f_T$ and $f_{max}$ (maximum oscillation frequency). For high-frequency applications, e.g. wireless communication, the SiGe HBT can be used to boost performance of existing double-polysilicon HF-ICs and BiCMOS technologies.

However, a simple, yet feasible method to fabricate high-performance SiGe HBT transistors is by using blanket epitaxial deposition of the device layers, and build-up of the device structure by mesa transistor formation, similar to standard fabrication of compound semiconductor devices. The mesa structure has been widely used to quickly verify concepts and explore device characteristics because of its simplicity and ease of fabrication. Typical SiGe mesa device structure types are described in.

Circuits of IC-type generally require more complicated structures, and the basic mesa concept is not suitable for this. Also, the maximum operating supply voltage is set by the $BV_{CBO}$ (collector-emitter breakdown voltage) of the transistor, which is proportional to $BV_{CBO}$ (collector-base breakdown voltage), and β (the DC current gain) of the transistor. The $BV_{CBO}$ is mainly set by the doping and the thickness of the collector layer. Only for low-voltage devices, the collector will be thin enough for easily making mesa structures feasible without too much topography.

High-frequency transistors were first fabricated in germanium in the late fifties but were soon replaced by silicon bipolar transistors in the beginning of the sixties, and have since then dominated the RF power area, especially for high output power levels and high supply voltages (25 V). Power transistors are especially designed to deliver high output power and high gain. Manufacturing process, device parameters, layouts and package are carefully tuned for this purpose. The devices need to meet numerous detailed requirements for breakdown voltages, DC gain or transconductance, capacitance, RF gain, ruggedness, noise figure, input/output impedance, distortion etc. The operating frequency ranges from several hundred MHz up into the GHz region. Because of the rapidly expanding telecommunications market, there is a strong driving force to further improve the existing technology, as well as to explore new types of devices.

For handheld wireless application, battery operation limits the supply voltage to the 3–6 V range. The output power ranges typically from 0.25 W up to 4 W. For maximum performance, discrete devices are used, and usually consist of one n-type device on a single die. The high output power is achieved by paralleling many transistor cells on a single die. The package may also be a module (typically a small ceramic substrate with semiconductor chips and passive components mounted on its surface, housed in one casing), and several RF power transistors dies may be used in a module.

For all types of high-frequency power transistors, a low impedance emitter/source path to ground is central for transferring the power to the load. This is true for all types of transistors, bipolar as well as FETs (field-effect transistors).

For IC-type of structures, complicated schemes are used to isolate the different device regions, e.g. well or trench isolations. Discrete bipolar devices generally have the collector as substrate, while emitter and base are contacted at the upper side of the semiconductor die using bond pads and bond wires. Only having two different types of contact at the front side ease the fabrication and connections to the device, especially for large power transistors where many transistor cells and bond wires are used.

A parasitic capacitance from metal patterns on the chip surface (base or emitter metalization) via the isolation layer to the substrate (collector) will occur. The collector-base capacitance (Miller capacitance) has a large impact on the gain and must be reduced. This can be done by using thick insulating silicon dioxide, and by using small base metalization area.

SUMMARY

By using a simplified mesa structure, specially designed for low-voltage discrete RF power transistors, combined with a "collector-up" approach used by some compound semiconductor device structures (e.g. GaAs HBTs), several advantages compared to existing discrete RF power transistors are obtained. A method for manufacturing a low voltage high frequency silicon power transistor applying epitaxial mesa structure using a minimized number of masks is disclosed and a low voltage high frequency silicon transistor chip presenting an epitaxial mesa technology silicon power device is presented. The silicon transistor presents a collector-up mesa structure having its substrate as a down facing emitter, and base and collector areas with bonding pads facing up, whereby the parasitic base-to-collector capacitance being almost entirely eliminated with the emitter as substrate. The fabrication process steps of this new structure are outlined.

A method according to the present invention is set forth by the independent claim 1 and the dependent claims 2–10. Further a transistor device according to the present invention is set forth by the independent claim 11.

BRIEF DESCRIPTION OF THE DRAWINGS

The invention, together with further objects and advantages thereof, may best be understood by making reference to the following description taken together with the accompanying drawings, in which.

DETAILED DESCRIPTION

The present inventive idea is based on a combination of knowledge from collector-up techniques in GaAs and the epi based, mesa etched Si/SiGe technology (e.g. see ref [4]). GaAs and Si are essentially two very different materials for creating semiconductor component structures. Design and production methods for such components therefore in most cases will look very different when comparing GaAs and Si technologies. Therefore it is not obvious for a person even skilled in the art how a component made in GaAs technology may be produced in silicon.

Advantages of the reversed structure, referred to as collector-up, are most apparent for discrete RF power components. The primary advantage for GaAs-based HBTs has been the reduction of CB-capacitance, and this will also be true for silicon-based HBTs. One advantage of the silicon techniques, which is difficult to obtain with GaAs, is that the emitter of the silicon component constitutes the (highly doped) silicon substrate, which is simply contacted at the back of the chip. This reduces the well-known problems of emitter inductance due to the bonding wire or wires. GaAs structures are built on a semi-insulating material and are contacted from the chip front side via bonding wires or even through plated pedestals, which also makes it complicated and expensive (Also see reference [5]).

Figure 1:
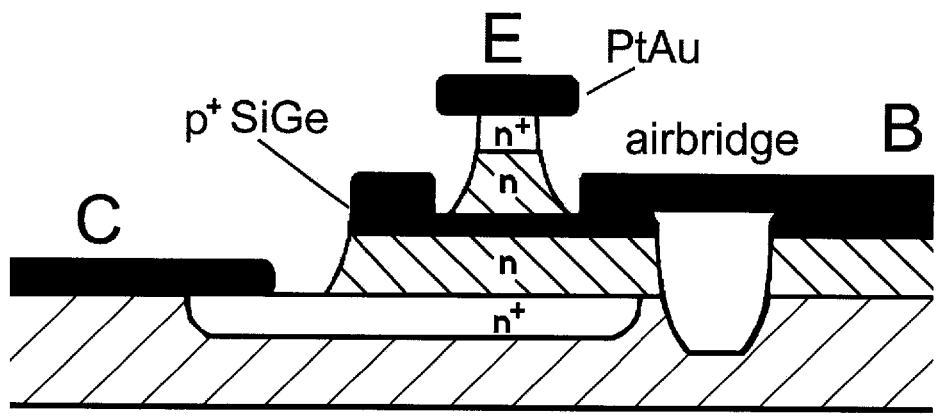
FIG. 1 illustrates an unpassivated double HBT mesa structure according to prior art.
Figure 2:
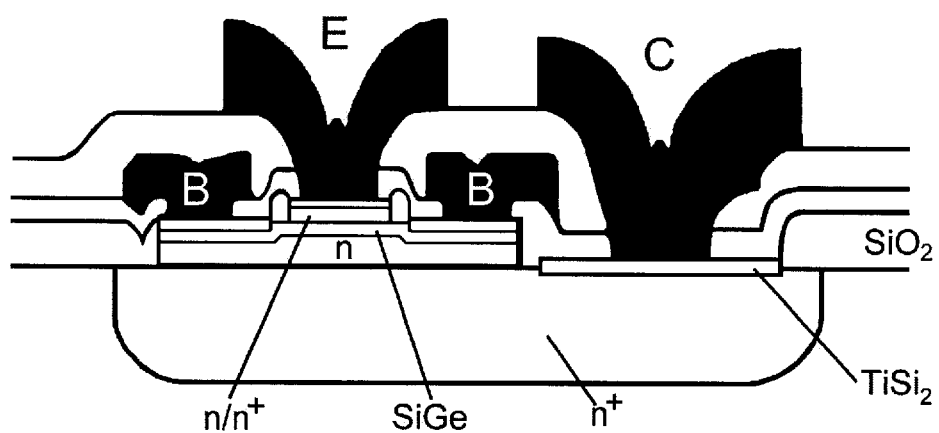
FIG. 2 illustrates a passivated double HBT mesa structure according to prior art.

FIGS. 1 and 2 show examples of prior art: two types of double HBT mesa structures, unpassivated as well as passivated.

The proposed structure will be described by illustrating an example of a fabrication flow. The special characteristics of the present proposed device are:

(1) primarily aimed for low voltages, (2) repeated collector-base structures for RF power output, (3) a discrete transistor with one terminal located on the backside, and two terminals on the front side, (4) not integratable otherwise all emitters connected to common ground.

The fabrication flow is started by selecting a highly doped silicon $n^{++}$ substrate 1, which will form the emitter contact of the structure. The crystal orientation should be <100> to be able to grow high-quality epitaxial layers on top of the substrate. The doping for $n^{++}$ may be close to the solubility limit.

Figure 3:
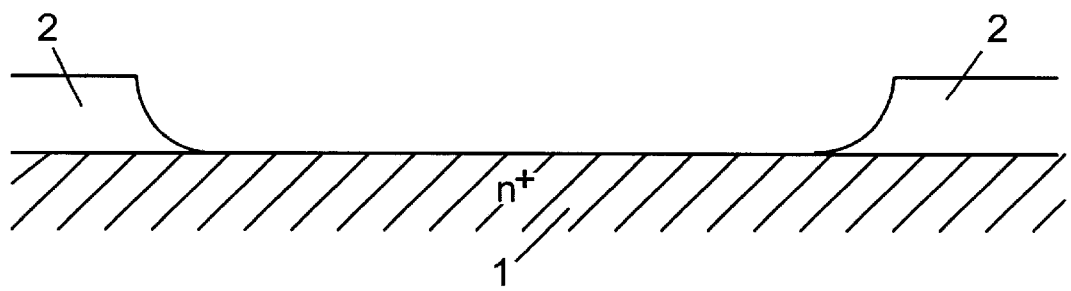
FIG. 3 illustrates isolation by thermal oxide and wet/dry etch.

As the first step, some device isolation scheme is being applied. In the FIGS. 3 to 5, three different (simple) ways are shown, depending on the needs for the structure. Since the oxide 2 for this device does not have to be very thick, FIGS. 3 and 4 will provide enough isolation for this purpose. A fully planar surface with very thick oxide will not be necessary, as in FIG. 5. In the following flow, the FIG. 4 LOCOS isolation will be used in a sequence of drawings illustrating the fabrication steps.

Figure 6:
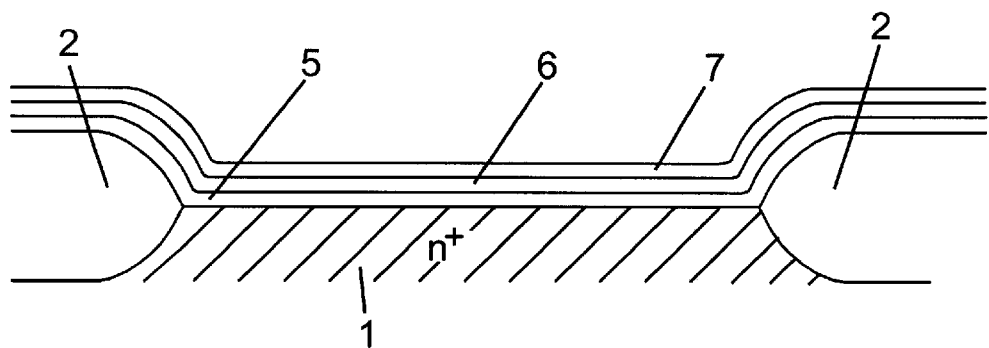
FIG. 6 illustrates deposit of base/collector structure.

Layers for the emitter, base, collector and collector contact will then be deposited, as indicated by FIG. 6. In one embodiment of the structure according to the present method the $n^+$ emitter 30 nm of $p^+$ base layer 5, 10–20% germanium (Ge), boron (B) doped density $10^{18}$–$10^{19}$ $cm^{-3}$, with undoped buffer layers, 300 nm of $n^-$ ($10^{16}$ $cm^{-3}$) collector layer 6, 100 nm of $n^+$ ($>10^{20}$ $cm^{-3}$) collector contact layer 7.

Typical n-dopants are arsenic (As) or antimony (Sb), while a typical p-dopant is boron (B).

The epitaxial silicon layer is deposited blanket (all of the wafer) using conventional methods, MBE or CVD. Then the silicon on top of the LOCOS field oxide is removed using one mask and dry etching. The silicon may also be selectively deposited only on open silicon areas, but this is more demanding on the process window.

Figure 7:
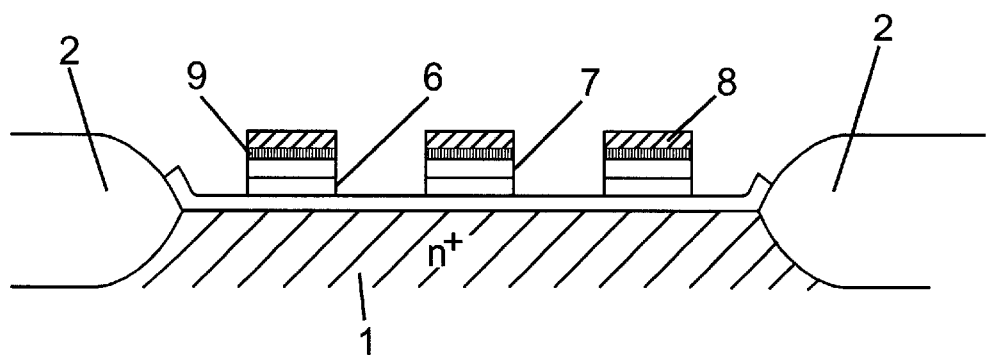
FIG. 7 illustrates the status after the step of etching base-collector mesa.
Figure 8:
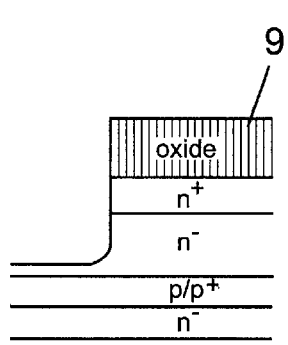
FIG. 8a is a more detailed view of a portion of FIG. 7 but layer of photoresist removed.
FIG. 8b is a view of the portion of FIG. 8a after creation of a side wall spacer and implant of boron down into the base layer.
Figure 8:
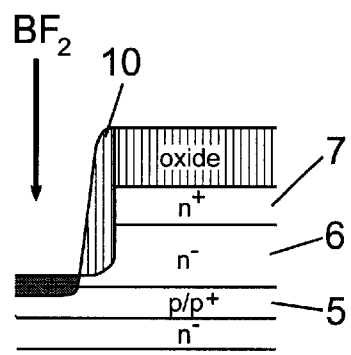

Next, part of the silicon is removed to open base contact areas. This constitutes then the mesa etch. The mask 8, may consist of just a photoresist, but depending on the etch as is indicated in FIG. 7 also photoresist may be used on top of a layer 9 of oxide, silicon nitride, titanium nitride etc., so that the additional layers also serves as a mask for the silicon etch and a following spacer formation. The etching may be performed wet, dry or a combination thereof. The important thing is to be able to stop at or close to the base layer which for instance a KOH (potassium hydroxide) wet etch, or high-precision RIE (reactive ion-etch) will allow. If the etch is not reaching the base layer 5 a indicated in FIG. 8(a) a boron implant can be performed according to FIG. 8(b) after forming a side wall spacer 10 for obtaining a proper base contact. In FIGS. 8(a) and 8(b) also a thin $n^-$ buffer layer is visible on top of the emitter $n^+$ region below the $p^+$ base region.

Figure 9:
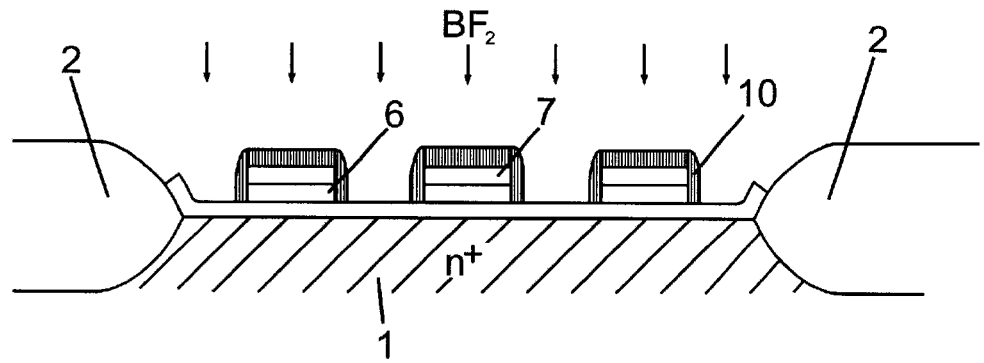
FIG. 9 illustrates the implantation of $BF_2$ after forming oxide spacers.

One enhancement embodiment is to mask for an additional boron implant, for instance by means of boron difluoride ($BF_2$), to form better base contacts, as is illustrated in FIG. 9. To ensure that the highly doped p+ contact areas do not come too close to the exposed collector mesa structure 6, 7, silicon dioxide ($SiO_2$) or silicon nitride ("SiN") side-wall spacers 10 are formed by depositing the layer, which will also protect the $n^+$ layer 7 after a dry etching of the structure. Then implantation of the $BF_2$ doping takes place. The boron dopant needs to be activated using a high-temperature anneal process, and this may be done at this point, or later, e.g. at 1000° C. during 20 seconds using an RTA (rapid-thermal anneal).

Figure 10:
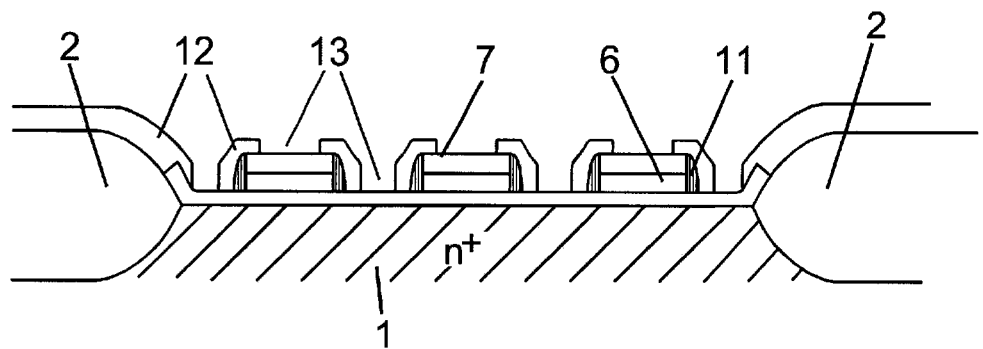
FIG. 10 illustrates the status after TEOS deposition and etching of contact holes.

After this implantation of boron the mask 10 is removed except for a residual spacer portion 11 at the sides of the mesa structures. The metalization is then started by depositing an insulating low-temperature oxide layer 12 (e.g. TEOS) over the structure and etching contact holes 13 to the collector and base contact areas, as shown in FIG. 10. To ensure low contact resistance to the silicon, a self-aligned silicide layer may be used, either after contact hole etch (e.g. PtSi), or before oxide deposition if the structure still contains the spacers (e.g. $TiSi_2$ SALICIDE (self-aligned silicide)).

Figure 11:
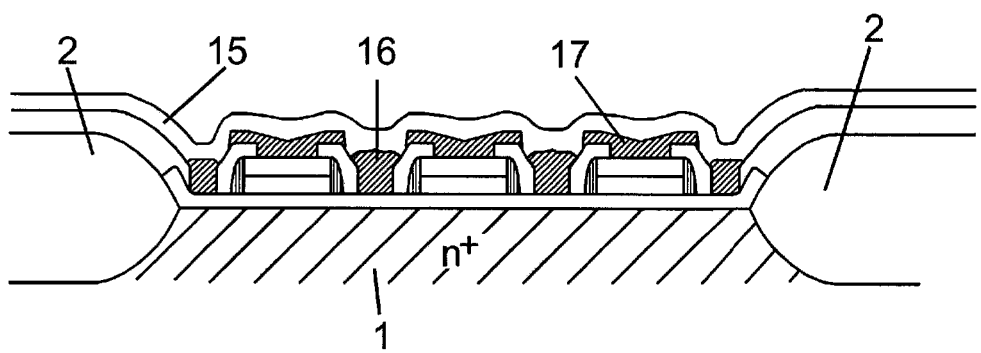
FIG. 11 illustrates a final metalized and passivated result of the fabrication process according to the present invention.

The metalization is continued by forming metal layers 16, 17 on top of the structure. This can be sputtered aluminum, which is dry etched as in standard silicon IC processing. It can also be sputtered and electroplated TiW/Au, which has been applied for our high voltage RF-Power devices, and has been described in U.S. Pat. No. 5,821,620 (also see ref. [6]), which is hereby incorporated by reference, or using the lift-off method or any other common method of metalization, The device structure is finished by depositing a passivation layer 15, which serves as a protection for mechanical scratches as well to hinder long-time degradation because of moisture etc. This protection may typically be oxide or nitride+oxide. The protection is removed on bond pad areas using a mask and standard dry etching techniques. The final structure is shown in FIG. 11.

Figure 12:
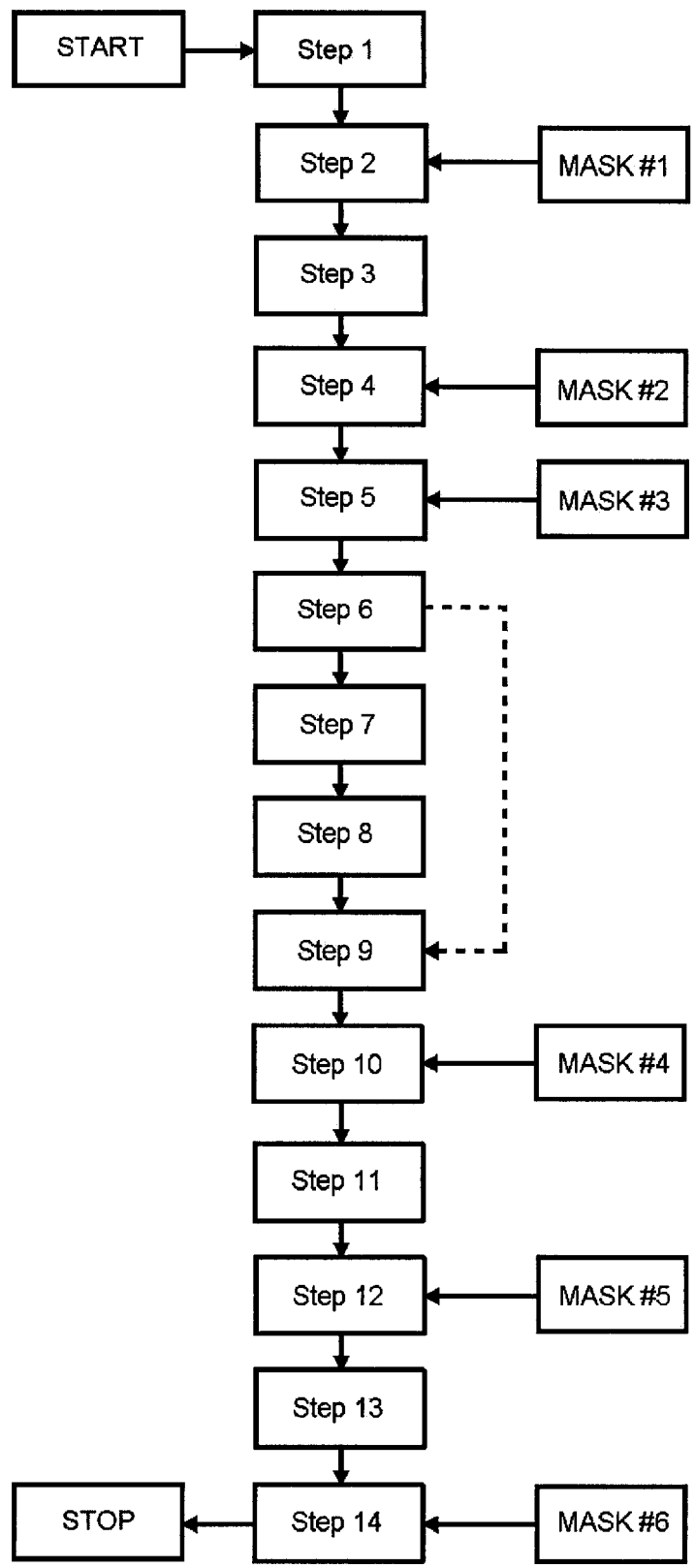
FIG. 12 demonstrates a flow chart of the present method.

The process flow of the inventive silicon power device can be summarized by the following 14 fabrication steps, including only 6 masks which is also shown in the flow chart of FIG. 12:

1. Start: Selection of starting material.
2. Device isolation. For a LOCOS isolation scheme: pad oxide growth, silicon nitride deposition, LOCOS mask (MASK #1), LOCOS nitride dry etch, LOCOS field oxidation, nitride etch, pad oxide etch.
3. Epitaxial deposition of emitter/base/collector stack. (MBE or CVD).
4. Etching of deposited silicon on field-oxide areas (MASK #2). (Dry etching.)
5. Etching of base-collector mesa (MASK #3). (Dry or wet etching.)
6. Formation of oxide or nitride spacers and deposit layer (Dry etching.)
7. Implantation of boron for better base contacts.
8. Activation (RTA).
9. Deposition of TEOS isolation for metalization.
10. Etching of contacts (MASK #4). (Dry or wet etch.)
11. Formation of silicide in contact areas. (Several methods available.)
12. Formation of metallization (MASK #5). (Several methods available.)
13. Deposition of final passivation layer. $SiO_2$ and/or SiN.
14. Etching of bond pad openings (MASK #6). (Dry etching.)

Consequently, this process flow described requires only 6 mask steps for manufacturing the desired silicon power transistor:

1 Mask for forming LOCOS field oxide
2 Mask for etch of deposited silicon on LOCOS field oxide
3 Mask for forming base-collector mesa
4 Mask for contact holes
5 Mask for metalization
6 Mask for bond pad openings The pronounced advantages of the present invention are:
The emitter impedance is reduced substantially and consists of resistance only, compared to emitter connected to ground using a bond wire.
The parasitic base-to-collector capacitance is almost entirely eliminated with the emitter as substrate.
An isolating oxide, (not present in the case of GaAs), presents good isolation between collector pads and substrate as well as between base pads and substrate. Thinner insulator will be needed for isolating base-emitter metalization to collector substrate. When using a plane structure it becomes simpler to achieve small dimensions.
Single-mesa instead of double mesa as is the case for GaAs-transistors and other silicon mesa transistor types.
General simplicity of fabrication. Fewer process steps and mask steps.

However the application of this structure is not limited to SiGe HBT device structures, but can be used for any deposited silicon-based type of structure, with the base layer/base doping and the thickness of other layers adjusted to obtain reasonable transistor parameters compared to the SiGe structure.

Figure 13:
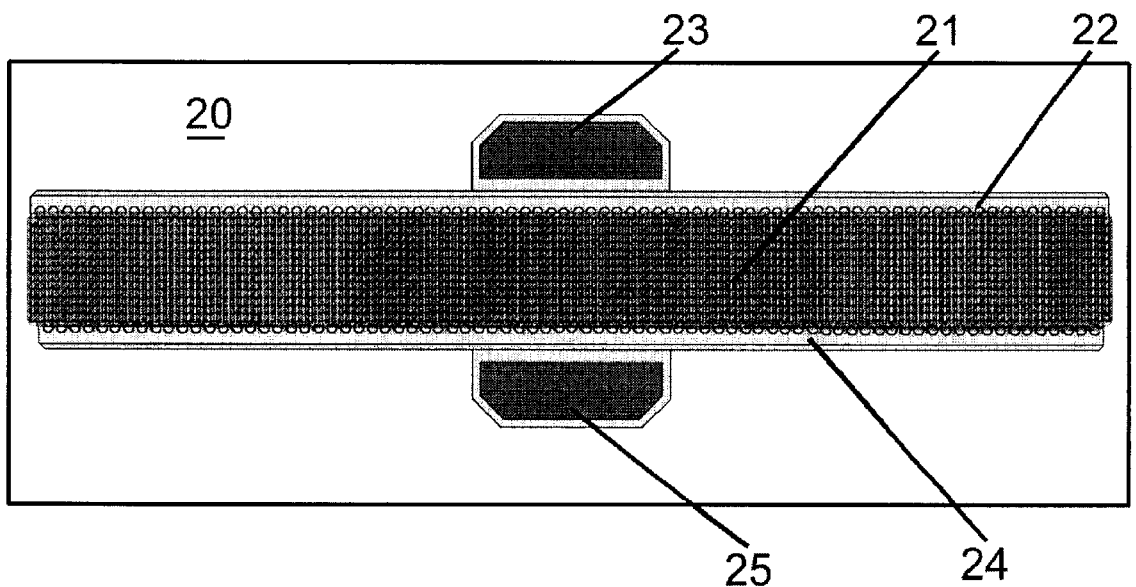
FIG. 13 illustrates an embodiment of a transistor chip manufactured in accordance to the present invention.

In the FIGS. 6 to 10 is visualized the build up of only 3 collector contacts and 4 base contacts, but in reality the structure may contain several hundreds of collector and base contacts. There will normally be an additional base contact compared to the number of collector contacts. In an illustrative embodiment a typical width of the collector mesas will be of the order 1–2 μm and the distance between the mesa structures forming the collector will also be of the order 1–2 μm. The collector metalization fingers at the upper side of the substrate are connected to one or several common collector bonding pads and the base metalization fingers are connected to one or several common base bonding pad at the upper side of the place opposing the collector bonding pads. The backside of the substrate forms the emitter contact of the transistor. It is not possible to arrange individual emitter ballast resistors. However emitter ballast resistors are not needed in this application due to the general characteristics of the transistor. In FIG. 13 is demonstrated an embodiment illustrating a silicon transistor chip 20 manufactured according to the present method. At the upper side of the chip is seen the active area 21 forming the collector mesa areas and base electrode areas. The base electrode areas are via metalization fingers 22 connected to a base bonding pad 23, while the collector mesas are connected to metalization fingers 24 connected to a collector bonding pad 25 and thus forming a collector-up device. The emitter area is connected at the backside of the chip 20.

It will be understood by those skilled in the art that various modifications and changes may be made to the present invention without departure from the scope thereof, which is defined by the appended claims.

REFERENCES

[1] D. Behammer, J. N. Albers, U. König, D. Temmler, D. Knoll, "Si/SiGe HBTs for Applications in Lower Power ICs", Solid-State Electronics, Vol. 39, No. 4, pp. 471–480, 1996.
[2] H. F. Cooke, "Microwave Transistors: Theory and Design", *Proc. IEEE,* vol. 59, p. 1163, August 1971.
[3] A. Schüppen, H. Dietrich, "High speed SiGe heterobipolar transistors", Journal of Crystal Growth, 157 (1995), p. 207–214.
[4] A. Gruhle, A Schüppen, "Recent advances with SiGe heterojunction bipolar transistors", Thin Solid Films, 1997, V 294, N1-2 (Feb. 15), pp. 246–249.
[5] Hin F. Chau, Hua Q. Tserng, U.S. Pat. No. 5,512,496 issued Apr. 30, 1996.
[6] S.-H. Hong, U.S. Pat. No. 5,821,620 issued Oct. 13, 1998.

What is claimed is:
1. A method for manufacturing a low voltage high frequency silicon power transistor applying epitaxial mesa structure using a minimized number of masks comprising the sequential steps of
selecting a highly doped n+ silicon substrate forming a transistor emitter region;
applying a device isolation scheme deciding a general upper structure of transistor base/collector regions;

depositing layers for a base/collector structure;

masking and forming collector mesas by etching down, at least close, to the layer which will form the base region;

depositing an insulating low-temperature oxide layer and creating contact holes to collector and base areas;

masking and forming metalization layers down into said contact holes interconnecting the base and collector areas, respectively, and depositing a passivation layer followed by masking and etching, thereby forming openings for further creation of base and collector contacts and bonding pads for respective base and collector metalization layers.

2. The method according to claim 1, wherein the transistor is a collector-up structure, comprising the further step of utilizing a local oxidation of silicon (LOCOS) isolation for said device isolation scheme before depositing said layers for the base/collector structure.

3. The method according to claim 2, comprising the further step of creating a thin $n^-$ layer on top of said highly doped silicon $n^+$ emitter substrate before depositing said layers for the base/collector regions.

4. The method according to claim 1, comprising, before the step of depositing an insulating low-temperature oxide layer and creating contact holes to the collector and base areas, the further step of forming an side wall spacers together with a remaining oxide layer and thereafter implanting a boron dopant into exposed base regions.

5. The method according to claim 4, comprising the further step of activating said boron dopant by a high temperature anneal of the silicon substrate.

6. The method according to claim 1, comprising, in combination with the step of deposition of the insulating low-temperature oxide layer, the further step of applying a self-aligned silicide after creating contact holes to the collector and base areas.

7. The method according to claim 4, comprising the further step of applying a self-aligned silicide, before deposition of an insulating low-temperature oxide layer, when the structure still contains spacers.

8. The method according to claim 1, wherein said step of forming metalization layers includes the steps of sputtering and dry etching.

9. The method according to claim 1, wherein said step of forming metalization layers includes the steps of sputtering and electroplating TiW/Au.

10. The method according to claim 1, wherein said step of forming metalization layers includes the step of utilizing evaporation of metal and lift-off.

11. A low voltage high frequency silicon transistor chip presenting an epitaxial mesa technology silicon power device, wherein said device presents a collector-up mesa structure having its substrate as a down facing emitter, and base and collector areas with bonding pads facing up, a parasitic base-to-collector capacitance being almost entirely eliminated with an emitter as substrate, said device being manufactured by steps in accordance with the method of claim 1.

* * * * *

UNITED STATES PATENT AND TRADEMARK OFFICE
CERTIFICATE OF CORRECTION

PATENT NO. : 6,329,259 B1
DATED : December 11, 2001
INVENTOR(S) : Johansson

Figure 4:
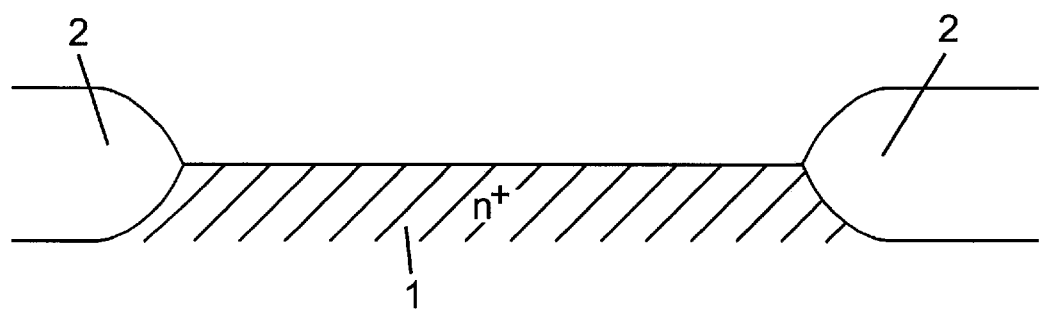
FIG. 4 illustrates isolation by a conventional LOCOS isolation step.
Figure 5:
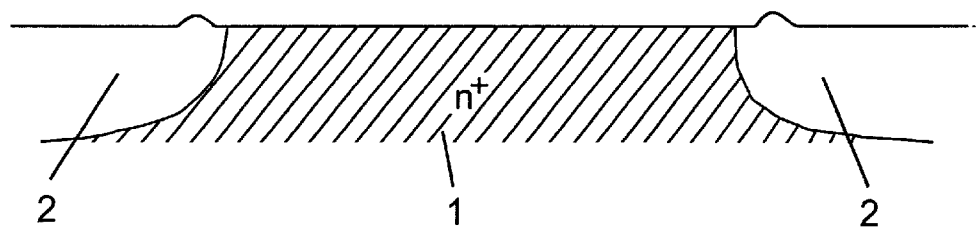
FIG. 5 illustrates isolation by a recessed LOCOS step.

It is certified that error appears in the above-identified patent and that said Letters Patent is hereby corrected as shown below:

<u>Column 4,</u>
Line 13, after "emitter" add -- substrate 1 of Figure 4 may obtain a thin layer of n by an implantation of boron before proceeding to the further step illustrated in Figure 6. The silicon layer combination may be selected something like:
*40-70 nm of n ($10^{18}$—$10^{19}$ cm$^{-3}$) emitter layer on top of the n$^+$ (>$10^{20}$ cm$^{-3}$) emitter 1, --

<u>Column 7,</u>
Line 26, delete "an"

Signed and Sealed this

Sixth Day of August, 2002

Attest:

JAMES E. ROGAN
Attesting Officer
Director of the United States Patent and Trademark Office